(12) United States Patent
Nelson

(10) Patent No.: US 6,285,078 B1
(45) Date of Patent: *Sep. 4, 2001

(54) THERMAL SPREADER CAP AND GREASE CONTAINMENT STRUCTURE FOR SEMICONDUCTOR DEVICE

(75) Inventor: Daryl James Nelson, Beaverton, OR (US)

(73) Assignee: Intel Corporation, Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/977,557

(22) Filed: Nov. 25, 1997

(51) Int. Cl.$^7$ .................................................. H01L 23/34
(52) U.S. Cl. ............................................. 257/712; 257/704
(58) Field of Search .................................. 257/704, 720, 257/706, 712, 718

(56) References Cited

U.S. PATENT DOCUMENTS

| | | | |
|---|---|---|---|
| 5,552,635 | * 9/1996 | Kim et al. | 257/706 |
| 5,862,038 | * 1/1999 | Suzuki et al. | 361/704 |
| 5,907,474 | * 5/1999 | Dolbear | 361/705 |

* cited by examiner

Primary Examiner—Carl Whitehead, Jr.
Assistant Examiner—Roy Potter
(74) Attorney, Agent, or Firm—Blakely, Sokoloff, Taylor & Zafman LLP

(57) ABSTRACT

An apparatus and method for protecting the various components of a microprocessor is provided. The apparatus includes a thermal spreader cap that is disposed between the processor die and thermal plate, and the OLGA and thermal plate. Thermal grease layers are also provided between the thermal spreader cap and the thermal plate, the thermal spreader cap and the processor die, and the thermal spreader cap and the OLGA. The apparatus provides a compliant assembly that protects the processor die from damage due to shock and/or vibration. It also provides multiple thermal paths along which heat generated by the various components of the microprocessor may be removed, and therefore allows for a higher performance processor.

21 Claims, 4 Drawing Sheets

THERMAL SPREADER CAP AND GREASE CONTAINMENT STRUCTURE FOR SEMICONDUCTOR DEVICE

BACKGROUND OF THE INVENTION

1. Field of the Invention

This invention relates generally to an apparatus and method for protecting a semiconductor device, and more particularly to an apparatus and method for protecting a microprocessor from damage due to shock and/or vibration, thermal overheating due to high heat flux between the microprocessor die and thermal plate and lack of thermal interface material.

2. Description of the Related Art

A number of different approaches have been tried to protect microprocessors from damage due to shock and/or vibration and thermal problems created by overheating. In one approach, the processor die is placed in direct contact with the pedestal portion of a thermal plate. This approach is an acceptable design from a thermal perspective for low heat fluxes because it permits heat to transfer directly from the processor die to the thermal plate. However, it may not be structurally sound because exterior shocks or vibrations imparted to the thermal plate are transmitted directly to the die.

In a modified version of this approach, a protective plastic or alternate material "donut" spacer is placed between the OLGA (Organic Land Grid Array) and the thermal plate. The protective donut is provided to absorb any shock and/or vibrations that may be imparted from the thermal plate to the die. The protective donut is not designed, however, to conduct heat. In an alternate approach, a grease layer is placed between the processor die and the pedestal. The thickness of the grease layer may vary between 0.002 inches and 0.009 inches. The maximum thickness is determined from the total tolerance across the interface between the OLGA and the thermal plate. In this approach, plastic donut spacers may also be provided between the OLGA and thermal plate to absorb shocks and/or vibrations imparted to the thermal plate.

With these approaches, the thickness of the pedestal extending from the thermal plate to the processor die must be tightly controlled. If it is not, shock or vibration applied to the thermal plate can cause the processor to become damaged, even in the designs utilizing the donut spacers. Maintaining a tightly controlled pedestal thickness is a difficult and expensive processing step in the overall construction of the microprocessor. Furthermore, with this design the thermal interface is somewhat thick. It has been found that the thicker the thermal interface is, the greater the thermal resistance from the processor die to the thermal plate will be, which in turn negatively impacts how quickly the processor die is cooled.

Furthermore, these approaches have limited applicability in that they are only capable of protecting microprocessors that operate at lower heat fluxes and associated lower performance. Future processors operating at higher frequencies will exceed the power limitations of these designs.

SUMMARY OF THE INVENTION

In one aspect of the present invention, an apparatus for protecting a semiconductor device from damage due to shock and/or vibration and overheating is provided. The apparatus includes a thermal spreader cap disposed between the semiconductor device and a thermal plate that transfers heat from the semiconductor device to the thermal plate.

In another aspect of the present invention, a method for protecting a semiconductor device from damage due to shock and/or vibration and overheating is provided. The method includes providing a thermal plate for dissipating heat generated by the semiconductor device, and inserting a thermal spreader cap between the semiconductor device and the thermal plate to dampen shock and/or vibration imparted to the semiconductor device through the thermal plate and facilitate the transfer of heat from the semiconductor device to the thermal plate. The invention also allows for less stringent tolerances and thicker thermal interfaces, resulting in lower costs and higher reliability and more robust designs.

BRIEF DESCRIPTION OF THE DRAWINGS

Other objects and advantages of the invention will become apparent upon reading the following detailed description and upon reference to the drawings in which.

Figure 1:
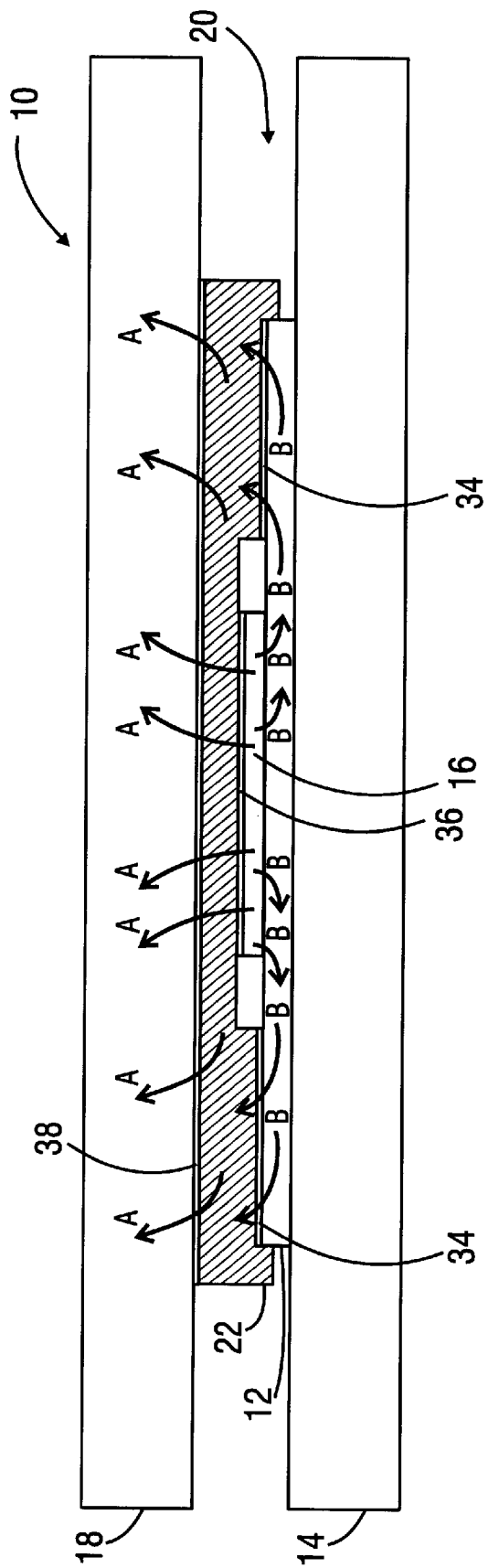
FIG. 1 is a cross-sectional view of an improved microprocessor assembly illustrating one embodiment of a thermal spreader cap according to the present invention.

While the present invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims. For example, although the invention is described as primarily protecting the processor die, it may also improve the cooling of other semiconductor components on the microprocessor substrate, such as the tag or BSRAM.

DETAILED DESCRIPTION OF SPECIFIC EMBODIMENTS

Turning now to the drawings and referring initially to FIG. 1, an improved microprocessor assembly is shown generally by reference numeral 10. The microprocessor assembly 10 includes an OLGA or printed circuit board 12 that is mounted to a substrate 14. The microprocessor assembly 10 also includes a processor die 16, which may be a control collapse chip connection (C4) chip, which is in turn mounted to the OLGA 12. The processor die 16 is an integrated circuit that is the processing core of the microprocessor assembly 10.

A thermal plate or heat sink 18 disposed above the OLGA 12 and processor die 16 is further provided for cooling the various electrical components of the microprocessor assembly 10. The thermal plate 18 performs this function by dissipating heat along its entire surface, which is many times the size of the OLGA 12 and processor die 16. As those of ordinary skill in the art will appreciate the thermal plate 18 is approximately the same size as the substrate 14, and may further attach to a heat sink.

The microprocessor assembly 10 further includes an apparatus 20 for protecting the processor die 16 from damage due to shocks and/or vibrations imparted to the processor die 16 by the thermal plate 18. The apparatus 20 also provides alternate paths for heat to flow from the processor die 16 to the thermal plate 18, and thereby reduces the temperature of the processor die 16. The apparatus 20 includes a thermal spreader cap 22, which is disposed between the processor die 16 and the thermal plate 18 and between the OLGA 12 and thermal plate 18. The thermal spreader cap 22 is preferably a rectangular-shaped aluminum plate that is either stamped or solid. However, as those of ordinary skill in the art will recognize other thermally conductive materials can be chosen.

Figure 2:
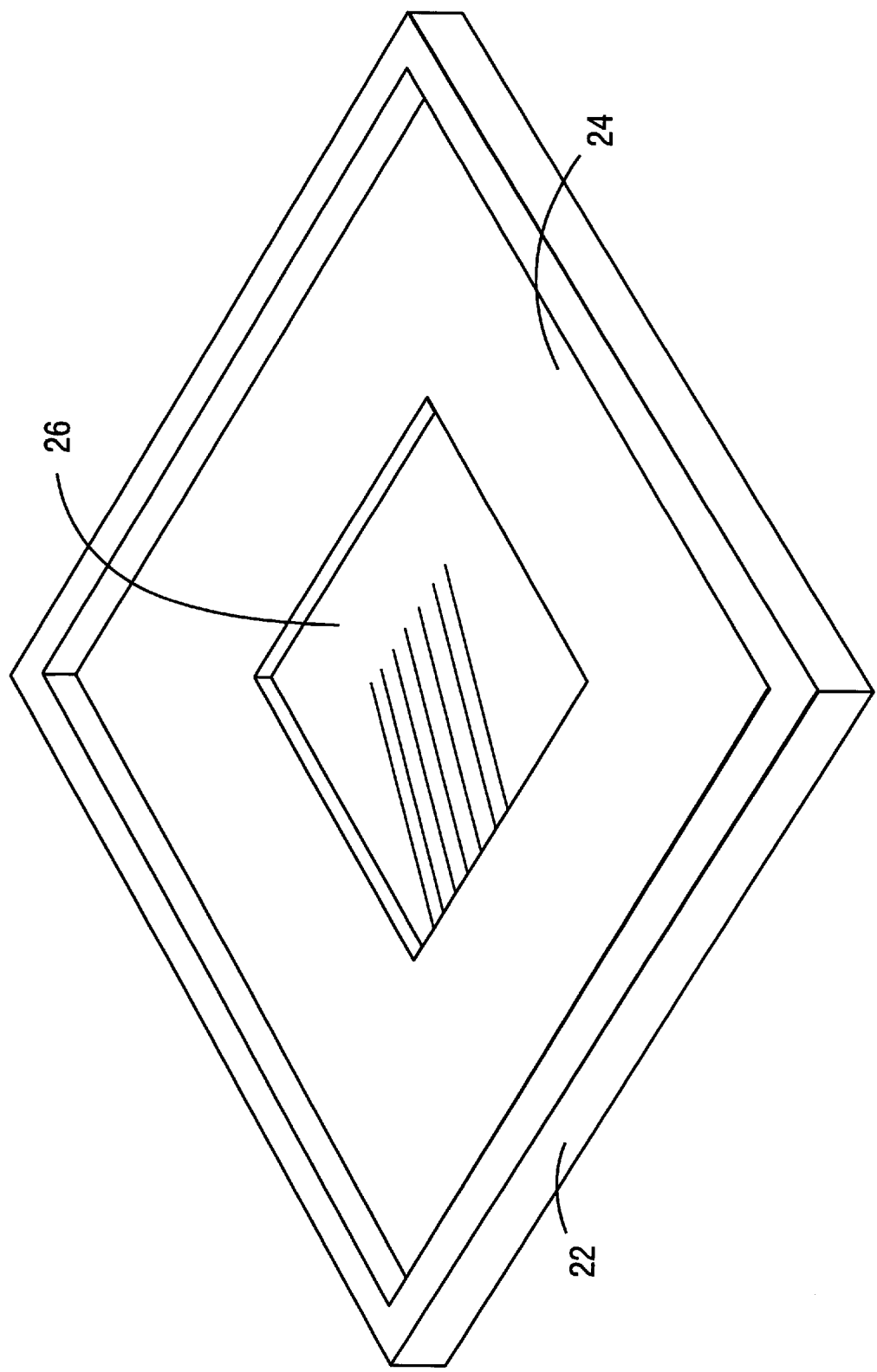
FIG. 2 is a bottom perspective view of the thermal spreader cap shown in FIG. 1.

The solid embodiment of the thermal spreader cap 22 is shown in FIG. 1. This embodiment is made by cold forging, die casting, or other similar high volume, low cost manufacturing techniques. In one embodiment, the thermal spreader cap 22 is approximately 1.0 inch wide by 1.0 inch long by 0.015 inches thick, but these dimensions may vary depending upon the dimensions of the OLGA 12 and processor die 16. In this embodiment the thermal spreader cap 22 has a rectangular-shaped indentation 24 formed along its outer perimeter and is designed to fit over and conform to the top surface of the OLGA 12, as shown in FIG. 2. The thermal spreader cap 22 also has another rectangular-shaped indentation 26 formed at its geometric center, and is adapted to fit over the processor die 16, as also shown in FIG. 2. In one embodiment, the thermal spreader cap 22 is about 0.085 inches thick at indentation 24, about 0.052 inches thick at indentation 26, and about 0.095 inches thick at its outer edge. An advantage of the solid design over the stamped design described below is that it does not require a pedestal, and therefore is less expensive to manufacture. However, the solid design is not as compliant as the stamped design.

Figure 3:
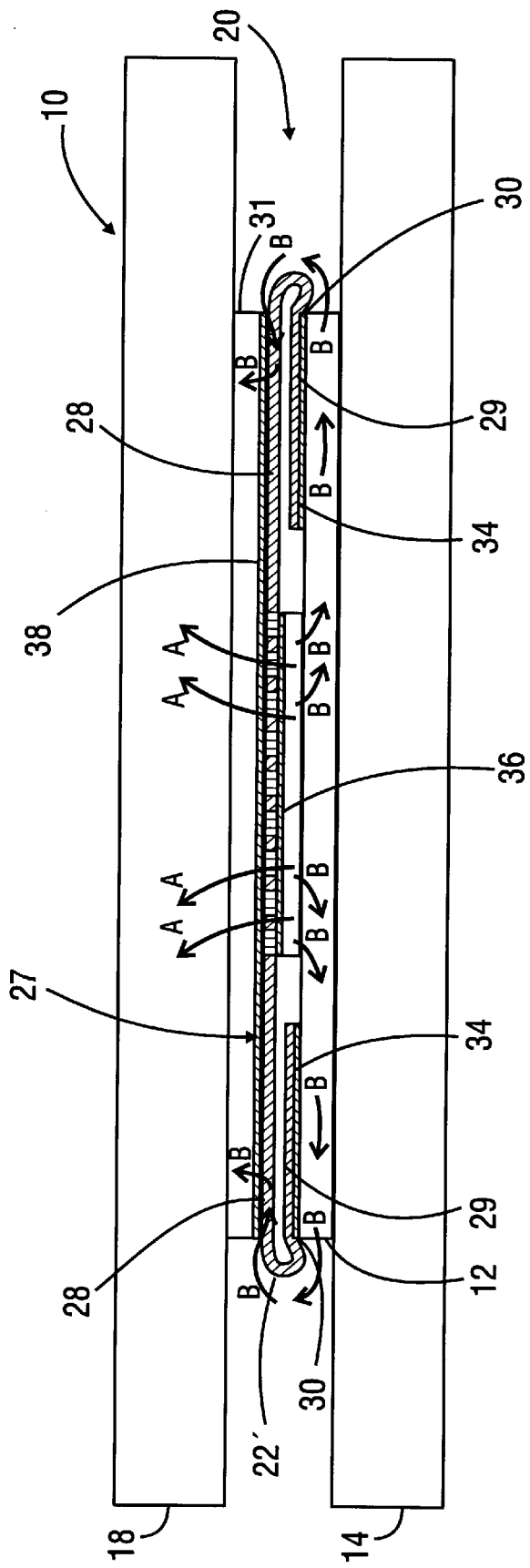
FIG. 3 is a cross-sectional view of an improved microprocessor illustrating another embodiment of a thermal spreader cap according to the present invention.

The stamped embodiment of the thermal spreader cap 22' is shown in FIG. 3. In this embodiment, the thermal spreader cap 22' is formed by bending an outer portion of a flat rectangular plate 27 under a top portion 28 thereby forming under supports 29. The resulting shape is springlike and has a spring constant that is a function of the thickness of the plate, the diameter of the bend, and the final geometry of the under supports 29. The stamped thermal spreader cap 22' is also formed such that its outer rim 30 conforms to the shape of the OLGA 12, as shown in FIG. 3. A pedestal 31 formed on or attached to the thermal plate 18 is provided with this design to transfer the heat that is transferred to the thermal spreader cap 22' to the thermal plate 18. In one embodiment, the pedestal 31 is integrally formed with the thermal plate 18.

The length and width dimensions of the stamped embodiment are substantially similar to that of the solid design. The thickness of the stamped thermal spreader cap 22' however is different than that of the solid design. The stamped thermal spreader cap 22' is about 0.015 inches thick at its geometric center, and about 0.048 inches thick at the under supports 29.

Figure 4:
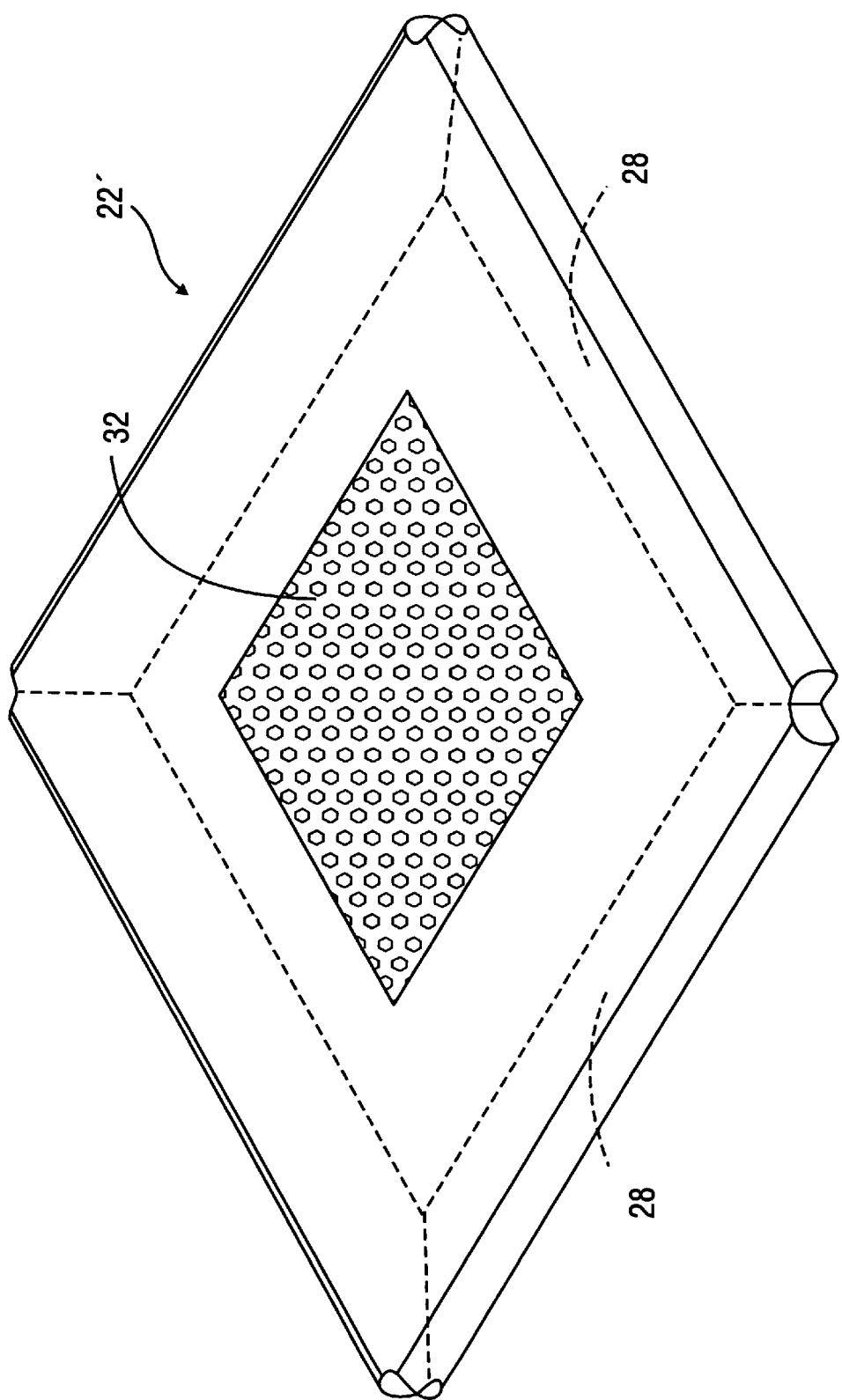
FIG. 4 is a top perspective view of the thermal spreader cap shown in FIG. 3.

In a modification of this design, the thermal spreader cap 22' is formed with perforations 32 in its center region to allow grease penetration and provide additional grease containment during power cycling reliability testing, as shown in FIG. 4. This configuration also allows for easy alignment of the thermal spreader cap 22' on the processor die 16 and OLGA 12 during manufacturing.

The apparatus 20 may further include grease layers disposed between the thermal spreader cap 22, 22' and its adjacent components. In particular, the protective apparatus 20, 22' may include a grease layer 34 disposed between the thermal spreader cap 22 and the OLGA 12, as shown on FIGS. 1 and 3. In one embodiment, the grease layer 34 is approximately 0.005 inches thick. The apparatus 20 may further include a grease layer 36 disposed between the thermal spreader cap 22, 22' and the processor die 16. In one embodiment, the grease layer 36 is approximately 0.003 to 0.008 inches thick. The apparatus 20 may also include a grease layer 38 disposed between the thermal spreader cap 22, 22' and the thermal plate 18. In one embodiment, the grease layer 38 is approximately 0.005 inches thick. The grease layers 34, 36, and 38 are preferably formed of silicon-based material, e.g., Shinetsu®, which is applied by a dispensing machine.

The thermal spreader cap 22, 22' provides structural support between the OLGA 12 and thermal plate 18, and thereby reduces damage to the processor die 16. The thermal spreader cap 22, 22' further absorbs shock and/or dampens vibrations imparted from the thermal plate 18 to the processor die 16. The flexible nature of the material used in making the thermal spreader cap 22' contributes to the ability of the apparatus 20 to absorb shock and/or dampen vibration imparted to the processor die 16. The under supports 28 in the stamped embodiment of the thermal spreader cap 22' further contribute to the protective apparatus 20's ability to absorb shock and/or dampen vibration imparted to the processor die 16. The grease layers 32, 34 and 36 also further enhance the shock absorbency and vibration dampening capabilities of the apparatus 20.

Another feature of the thermal spreader cap 22, 22' is that it provides another thermal path for heat transfer. Heat is transferred from the processor die 16 through the OLGA 12 to the spreader cap 22, 22', and ultimately to the thermal plate 18 along multiple thermal paths. This facilitates the spreading of heat from the processor die 16 to the thermal plate 18, and thus assists in cooling the microprocessor assembly 10. The primary thermal path along which heat is transferred is still from the processor die 16, through the grease layer 36, through the thermal spreader cap 22, 22', through the grease layer 38, and to the thermal plate 18, as indicated by the arrows A in FIG. 1. In the stamped embodiment of the thermal spreader cap 22', heat is further transferred through the pedestal 31 before it is transferred to the thermal plate 18, as shown in FIG. 3. The secondary thermal path along which heat is transferred is from the OLGA 12 to the grease layer 34, through the thermal spreader cap 22, 22' and through the grease layer 38 to the thermal plate 18, as indicated by the arrows B in FIG. 1. Again, in the stamped embodiment of the thermal spread cap 22', heat is further transferred through the pedestal 31 before it is transferred to the thermal plate 18, as shown in FIG. 3.

One significant advantage of the present invention over prior designs is the creation of this secondary thermal path. It allows for more efficient cooling of the OLGA 12 than was previously possible. The secondary thermal path also facilitates cooling of other components on the substrate 14, such as the Tag (not shown) and the BSRAMs (not shown).

Another advantage of the present invention over the prior designs, is that the grease interfaces reduce the tolerance requirements for the pedestal 31 and thermal plate 18, which make manufacturing these components simpler and less expensive.

In another alternate design, the thermal spreader cap 22, 22' according to the present invention could also be electrically interfaced to the top of the OLGA 12 for EMI (electromagnetic inductance) containment from the processor die 16 at interface 34. This is accomplished by inserting an electrically conductive material between the thermal spreader cap 22, 22' and the OLGA 12, e.g., an electrically conductive epoxy or metal solder. This alternate design also increases the thermal performance of interface 34 to the thermal spreader cap 22, 22'.

In one embodiment, the microprocessor assembly 10 is assembled as follows. First, the OLGA 12 and processor die 16, Tag and BSRAMs are soldered onto the substrate 14. Then, the thermal grease layers 34 and 36 are applied to the OLGA 12 and processor die 16, respectively. Next, the thermal spreader cap 22 is fitted over the OLGA 12 and processor die 16. Then, the thermal grease layer 38 is applied to the top surface of the thermal spreader cap 22. Finally, the thermal plate 18 is fitted over the thermal spreader cap 22 and clipped to the substrate 14. In the case of the stamped embodiment of the thermal spreader cap 22', the pedestal 31 can be integrally formed with the thermal plate 18 at the time that the thermal plate is made or separately formed and attached to the thermal plate 18. As those of ordinary skill in the art will appreciate, other assembly steps may be followed to construct the present invention.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A microprocessor assembly, comprising:
   a printed circuit board;
   a thermal plate
   a semiconductor device mounted on the printed circuit board; and
   a thermal spreader cap disposed between the semiconductor device and the thermal plate to provide a first thermal path for heat transfer from the semiconductor device to the thermal plate, and the thermal spreader cap also disposed between the printed circuit board and the thermal plate to provide a second thermal path for heat transfer from the semiconductor device to the thermal plate through the printed circuit board; wherein
   a portion of the thermal spreader cap extending past edges of the printed circuit board enhances flexibility to absorb shock or dampen vibrations imparted to the semiconductor device.

2. The microprocessor assembly of claim 1 further comprising a layer of grease disposed between the thermal spreader cap and the thermal plate, between the thermal spreader cap and the semiconductor device, and between the thermal spreader cap and the printed circuit board.

3. The microprocessor assembly of claim 2 wherein the layer of grease disposed between the thermal spreader cap and the thermal plate is approximately 0.005 inches thick.

4. The microprocessor assembly of claim 2 wherein the layer of grease disposed between the thermal spreader cap and the printed circuit board is approximately 0.005 inches thick.

5. The microprocessor assembly of claim 2 wherein the layer or grease disposed between the thermal spreader cap and the semiconductor device is approximately between 0.003 and 0.008 inches thick.

6. The microprocessor assembly of claim 1 wherein the thermal spreader cap is generally rectangular-shaped.

7. The microprocessor assembly of claim 6 wherein the thermal spreader cap is perforated in a region adjacent the semiconductor device.

8. The microprocessor assembly of claim 6 wherein the thermal spreader cap has a rectangular-shaped indentation in its center region to receive the semiconductor device.

9. The microprocessor assembly of claim 1 wherein the portion of the thermal spreader cap extending past edges of the printed circuit board is folded back to reside over the printed circuit board.

10. The microprocessor assembly of claim 1 wherein the semiconductor device is a processor die.

11. The microprocessor assembly of claim 1 further comprising an electrically conductive material inserted between the thermal spreader cap and the printed circuit board.

12. An apparatus comprising:
    a printed circuit board;
    a thermal plate;
    a semiconductor die mounted on the printed circuit board; and
    a thermal spreader cap disposed between the semiconductor die and the thermal plate to provide a first thermal path for heat transfer from the semiconductor die to the thermal plate, and the thermal spreader cap also disposed between the printed circuit board and the thermal plate to provide a second thermal path for heat transfer from the semiconductor die to the thermal plate through the printed circuit board;
    a portion of the thermal spreader cap extending past edges of the printed circuit board enhances flexibility to absorb shock or dampen vibrations imparted to the semiconductor die.

13. The apparatus of claim 12 further comprising a layer of grease disposed between the spreader cap and the semiconductor die and between the spreader cap and the printed circuit board.

14. The apparatus of claim 12 further comprising a pedestal disposed between the thermal spreader cap and the thermal plate.

15. The apparatus of claim 12 wherein the spreader cap is generally rectangular-shaped and the portion of the therna spreader cap extending nast edges of the pnted circuit board is folded back to reside over the pnted circuit board.

16. The apparatus of claim 15 wherein the spreader cap is perforated in a region adjacent the semiconductor die.

17. The apparatus of claim 15 wherein the spreader cap has one rectangular-shaped indentation in a center region to receive the semiconductor die.

18. The apparatus of claim 15 wherein a flexibility of the spreader cap is determined by a spring constant that is a function of thickness, diameter of a bend forward when folded back, and geometry of the portion folded back.

19. An apparatus, comprising:
    a printed circuit board;
    a semiconductor device coupled to said printed circuit board;
    a thermal plate;
    means for providing a first thermal path for heat transfer from the semiconductor device to the thermal plate, and a second thermal path for heat transfer from the semiconductor device to the thermal plate, through the printed circuit board whin a portion of the providing means extending past edges of the punted circuit board enhances flexibility to absorb shock or dampen vibrations imparted to the semiconductor device.

20. The apparatus of claim 19 wherein said means for providing a first and second thermal path includes a thermal spreader cap disposed between said thermal plate and said printed circuit board and between said thermal plate and said semiconductor device.

21. The apparatus of claim 19 wherein the portion of the providing means extending past edges of the printed circuit board is folded back to reside over the printed circuit board.

* * * * *